United States Patent
Feng et al.

(10) Patent No.: US 11,532,278 B2
(45) Date of Patent: Dec. 20, 2022

(54) SHIFT REGISTERS, GATE DRIVING CIRCUITS AND DRIVING METHODS THEREOF, AND DISPLAY DEVICES

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/512,533

(22) Filed: Oct. 27, 2021

(65) Prior Publication Data

US 2022/0310020 A1    Sep. 29, 2022

(30) Foreign Application Priority Data

Mar. 26, 2021    (CN) .......................... 202110328610.4

(51) Int. Cl.
     *G09G 3/3266*      (2016.01)
     *G09G 3/3225*      (2016.01)
     *G11C 19/28*      (2006.01)

(52) U.S. Cl.
     CPC ......... *G09G 3/3266* (2013.01); *G09G 3/3225* (2013.01); *G11C 19/28* (2013.01);
     (Continued)

(58) Field of Classification Search
     CPC ............... G09G 3/3266; G09G 3/3225; G09G 2300/0842; G09G 2300/0861;
     (Continued)

(56) References Cited

U.S. PATENT DOCUMENTS

2015/0170578 A1    6/2015    Choi
2016/0071445 A1    3/2016    Kim et al.
(Continued)

FOREIGN PATENT DOCUMENTS

CN      105427794 A      3/2016
CN      107863067 A      3/2018
(Continued)

OTHER PUBLICATIONS

CN2021103286104 first office action.

*Primary Examiner* — Premal R Patel
(74) *Attorney, Agent, or Firm* — IPro, PLLC

(57) ABSTRACT

A shift register driving method includes: in a black insertion driving period, the black insertion input circuit, in response to a black insertion control signal, causing the output circuit to first output a first sense driving signal and a second sense driving signal, so that the control electrode of the switching transistor receives the first sense driving signal to turn on the switching transistor, the first electrode of the switching transistor receives a sensing data signal, and the control electrode of the sensing transistor receives the second sense driving signal to turn on the sensing transistor, and a second electrode of the sensing transistor outputs a pixel compensation signal, at the same time the sub-pixel stops emitting light; the output circuit outputs a black insertion driving signal, and the pixel circuit receives the black insertion driving signal to turn off the driving transistor, and the sub-pixel keeps not emitting light.

20 Claims, 6 Drawing Sheets

(52) U.S. Cl.
CPC .............. *G09G 2300/0842* (2013.01); *G09G 2300/0861* (2013.01); *G09G 2310/0286* (2013.01); *G09G 2310/08* (2013.01); *G09G 2320/0233* (2013.01); *G09G 2320/0261* (2013.01); *G09G 2320/0295* (2013.01)

(58) Field of Classification Search
CPC ....... G09G 2310/0286; G09G 2310/08; G09G 2320/0233; G09G 2320/0261; G09G 2320/0295; G11C 19/28
See application file for complete search history.

(56) References Cited

U.S. PATENT DOCUMENTS

| | | |
|---|---|---|
| 2017/0316738 A1 | 11/2017 | Sohn |
| 2019/0189056 A1* | 6/2019 | Gai ...................... G09G 3/3233 |
| 2020/0035165 A1* | 1/2020 | Park ..................... G09G 3/3258 |
| 2020/0051656 A1* | 2/2020 | Feng .................... G11C 19/287 |
| 2020/0074932 A1* | 3/2020 | Park ..................... G09G 3/3291 |
| 2020/0074933 A1* | 3/2020 | Ban ...................... G09G 3/3283 |
| 2020/0160781 A1 | 5/2020 | Park |
| 2020/0372965 A1 | 11/2020 | Yuan et al. |
| 2021/0201810 A1 | 7/2021 | Feng et al. |

FOREIGN PATENT DOCUMENTS

| | | |
|---|---|---|
| CN | 109920465 A | 6/2019 |
| CN | 109935212 A | 6/2019 |
| CN | 111199708 A | 5/2020 |
| CN | 111261116 A | 6/2020 |
| CN | 111445861 A | 7/2020 |
| CN | 111599315 A | 8/2020 |
| JP | 2017198967 A | 11/2017 |

\* cited by examiner

SHIFT REGISTERS, GATE DRIVING CIRCUITS AND DRIVING METHODS THEREOF, AND DISPLAY DEVICES

CROSS-REFERENCES TO RELATED APPLICATIONS

This patent application claims the priority of a Chinese patent application No. 2021103286104, filed on Mar. 26, 2021, and entitled "SHIFT REGISTERS, GATE DRIVING CIRCUITS AND DRIVING METHODS THEREOF, AND DISPLAY DEVICES", the entire content of which is hereby incorporated by reference for all purposes.

TECHNICAL FIELD

The present disclosure relates to the field of display technology, and more particular, to a shift register, a gate driving circuit and a driving method thereof, and a display device.

BACKGROUND

With the continuous development of display technology, high-resolution, narrow-bezel display devices have become one of the mainstream development trends in the display field. For this reason, GOA (Gate On Array, array substrate row drive) technology has been adopted in the display devices to realize the narrow bezels or no bezels for the display devices.

During a display process of a display panel, an image streaking phenomenon will occur when frames of motion pictures are being switched. Generally, black insertion is performed in a display interval of a frame to shorten a response time of the displayed frame for the motion pictures. In order to improve the display effect of the display panel, sub-pixels of the display panel need to be compensated externally. As a result, the circuit structure of the gate driving circuit in the related art is relatively complicated, and the driving process is also relatively complicated.

SUMMARY

The present disclosure provides a shift register, a gate driving circuit and a driving method thereof, and a display device.

A first aspect of the embodiments of the present disclosure provides a driving method of a shift register, applied for a shift register, wherein the shift register is used to drive a pixel circuit, the pixel circuit is used to drive a sub-pixel; the pixel circuit includes a switching transistor, a driving transistor, a storage capacitor, a sensing transistor, and a control node, a first electrode of the sensing transistor, the sub-pixel and the driving transistor are respectively connected to the control node; the shift register includes a display input circuit, a black insertion input circuit and an output circuit, the output circuit is used to output a composite driving signal, the composite driving signal includes a display driving signal, a first sense driving signal, a second sense driving signal, and a black insertion driving signal; during display of one frame of picture, the black insertion driving signal is output after the first sense driving signal and the second sense driving signal; the driving method of the shift register includes: in a display driving period, the display input circuit, in response to a display control signal, causing the output circuit to output the display driving signal, so that a control electrode of the switching transistor receives the display driving signal to turn on the switching transistor, a first electrode of the switching transistor receives a display data signal, and the sub-pixel emits light; and in a black insertion driving period, the black insertion input circuit, in response to a black insertion control signal, causing the output circuit to first output a first sense driving signal and a second sense driving signal, so that the control electrode of the switching transistor receives the first sense driving signal to turn on the switching transistor, the first electrode of the switching transistor receives a sensing data signal, and the control electrode of the sensing transistor receives the second sense driving signal to turn on the sensing transistor, and a second electrode of the sensing transistor outputs a pixel compensation signal, and at the same time the sub-pixel stops emitting light; then the output circuit outputs a black insertion driving signal, and the pixel circuit receives the black insertion driving signal to turn off the driving transistor, and the sub-pixel keeps not emitting light.

In one implementation, the black insertion driving signal includes a first black insertion driving signal; the output circuit outputting a black insertion driving signal, and the pixel circuit receiving the black insertion driving signal to turn off the driving transistor includes: the output circuit outputting a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor; or, wherein the black insertion driving signal includes a first black insertion driving signal and a second black insertion driving signal; the output circuit outputting a black insertion driving signal, and the pixel circuit receiving the black insertion driving signal to turn off the driving transistor includes: the output circuit outputting the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor, the second electrode of the sensing transistor receives the second black data signal and writes the second black data signal into the storage capacitor to turn off the driving transistor. or, the black insertion driving signal includes a second black insertion driving signal; the output circuit outputting a black insertion driving signal, and the pixel circuit receiving the black insertion driving signal to turn off the driving transistor includes: the output circuit outputting a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

A second aspect of the embodiments of the present disclosure provides a shift register, wherein the shift register is used to implement the driving method of a shift register described above, the shift register includes a black insertion input circuit, a display input circuit, a pull-up node and an output circuit; an output terminal of the black insertion input circuit and an output terminal of the display input circuit are respectively connected to the pull-up node to charge the pull-up node; and a control terminal of the output circuit is connected to the pull-up node, in a display driving period, the display input circuit charges the pull-up node in response to a display control signal, and under the control of the pull-up node, an output terminal of the output circuit outputs a display driving signal; in a black insertion driving period, the black insertion input circuit charges the pull-up node in response to a black insertion control signal, and under the control of the pull-up node, the output terminal of the output circuit first outputs a first sense driving signal and a second sense driving signal, and then outputs a black insertion driving signal.

In one implementation, the output circuit includes a first output unit and a second output unit, and the display input circuit includes a first display input unit and a second display input unit, and the pull-up node includes a first pull-up node and a second pull-up node; the output terminal of the black insertion input circuit is respectively connected to the first pull-up node and the second pull-up node; an output terminal of the first display input unit is connected to the first pull-up node, and a control terminal of the first output unit is connected to the first pull-up node; an output terminal of the second display input unit is connected to the second pull-up node, and a control terminal of the second output unit is connected to the second pull-up node; the first output unit and the second output unit respectively output composite driving signals for driving sub-pixels in different rows.

In one implementation, the shift register further includes a black insertion pre-charging circuit and a black insertion control node, and an output terminal of the black insertion pre-charging circuit is connected to the black insertion control node, the black insertion pre-charging circuit is used to charge the black insertion control node; a control terminal of the black insertion input circuit is connected to the black insertion control node; an output terminal of the black insertion input circuit is respectively connected to the first pull-up node and the second pull-up node; and the black insertion control signal includes a potential at the black insertion control node and the black insertion input signal; the black insertion input circuit, in response to the potential at the pull-up control node and a black insertion input signal, charges the first pull-up node and the second pull-up node.

In one implementation, the shift register further includes a pull-down control circuit and a pull-down node; the output circuit further includes a pull-down circuit; the pull-down control circuit is used to control the level of the pull-down node, and the pull-down circuit responds to the level of the pull-down node to pull down reset the pull-up node and the output terminal of the output circuit.

A third aspect of the embodiments of the present disclosure provides a gate driving circuit, including a plurality of cascaded shift registers, the shift register being the shift register described above.

A fourth aspect of the embodiments of the present disclosure provides a display device, wherein the display device includes the gate driving circuit described above and a display panel, and the display panel includes a plurality of rows of sub-pixels and a pixel circuit for driving the sub-pixels; when a shift register of the gate driving circuit includes a first output unit and a second output unit, an output terminal of the first output unit and the output terminal of the second output unit are respectively connected to the pixel circuits corresponding to the sub-pixels in different rows.

A fifth aspect of the embodiments of the present disclosure provides a driving method of a gate driving circuit, wherein the driving method is used in the gate driving circuit described above; a display period of one frame of picture includes a first sub-period and a second sub-period, and the gate driving circuit includes n shift registers, the driving method of the gate driving circuit includes: in the first sub-period, controlling a 1st stage to a mth stage shift registers to be in a display driving stage; controlling a (m+1)th stage to a nth stage shift register to be in a black insertion driving stage, and controlling one of shift registers of the (m+1)th stage shift register to the nth stage shift register to first output a first sense driving signal and a second sense driving signal, and then output a black insertion driving signal and controlling other shift registers to output only the black insertion driving signal; where $m>1$, $m+1<n$, and both m and n are positive integers; and in a second sub-period, controlling the 1st stage to the mth stage shift registers to be in a black insertion driving stage; controlling one of the shift registers of the first stage shift register to the mth stage shift register to first output a first sense driving signal and a second sense driving signal, and then output a black insertion driving signal and controlling other shift registers to output only the black insertion driving signal; controlling the (m+1)th stage to the nth stage shift registers to be in a display driving stage.

In one implementation, the display panel on which the gate driving circuit is disposed includes a plurality of rows of sub-pixels, and the driving method of the gate driving circuit further includes: during display of one frame of picture, the gate driving circuit outputting a first sense driving signal and a second sense driving signal corresponding to one row of sub-pixels; during display of a plurality of frames of pictures, controlling the gate driving circuit to sequentially output a first sense driving signal and a second sense driving signal on a corresponding row of sub-pixels row by row according to an order for driving the rows of sub-pixels.

The main technical effects achieved by the embodiments of the present disclosure are: in the black insertion driving stage, the black insertion input circuit of the shift register responds to a black insertion control signal, and the output circuit first outputs a first sense driving signal and a second sense driving signal then outputs a black insertion driving signal. The pixel circuit detects the pixel compensation signal while driving the sub-pixels to not emit light. That is, the shift register can drive the pixel circuit to realize the detection of black insertion and sub-pixel compensation signals during the black insertion driving stage, so there is no need to provide a sensing driving period in the driving process of the shift register, which can simplify the driving process of the shift register and simplify the driving timing sequence. In the process of driving the pixel circuit by the shift register, there is no need to provide a sense driving signal to the shift register, and the shift register can do without a sensing input circuit, which can simplify the circuit of the shift register. The detection of the pixel compensation signal is completed in the black insertion driving stage, the sub-pixels do not emit light during the detection of the pixel compensation signal, and after the detection of the pixel compensation signal is completed, the pixel circuit receives the black insertion driving signal to turn off the driving transistor and the sub-pixels remain not emitting light. Therefore, the display device will not have regular black streaks during the detection of the pixel compensation signal, and the display effect of the display device will not be affected.

It is to be understood that the above general descriptions and the below detailed descriptions are merely exemplary and explanatory, and are not intended to limit the present disclosure.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

DETAILED DESCRIPTION OF THE EMBODIMENTS

Figure 1:
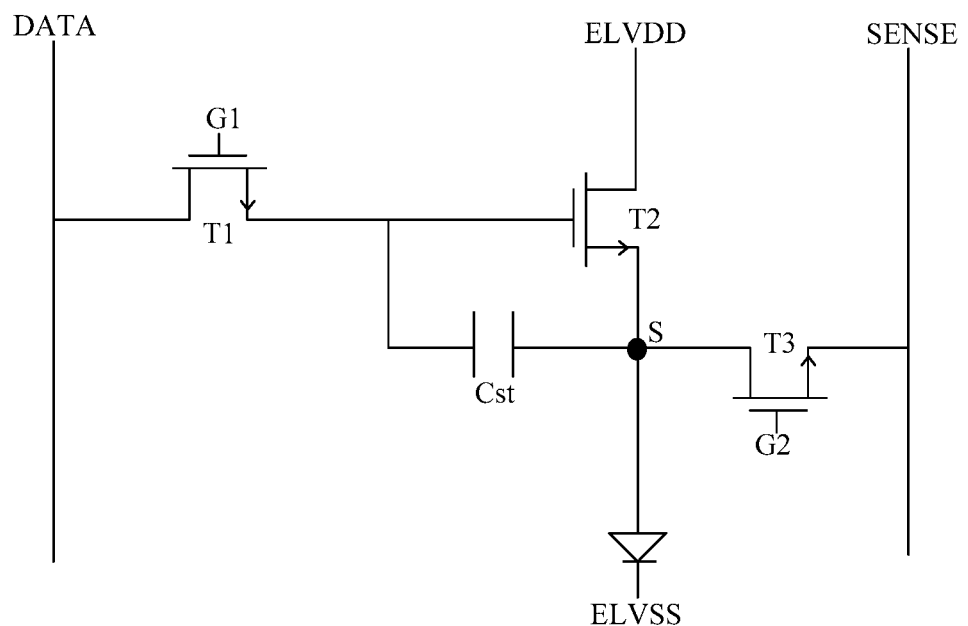
FIG. 1 is a circuit diagram of a pixel circuit according to an example of the present disclosure.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

As mentioned in the Background, in display devices, especially organic light-emitting diode display devices, in order to avoid image streaking phenomenon while frames are being switched for motion pictures, black insertion is generally performed in a display interval of a frame shorten a response time of the displayed frame for the motion pictures. In order to improve the uniformity of display brightness across the display panel, it is necessary to externally compensate the sub-pixels of the display panel.

The transistors used in the embodiment of the present disclosure can all be thin film transistors or field effect transistors or other devices with the same characteristics. In an example, the transistor used in the embodiment of the present disclosure is a thin film transistor, for example, an oxide semiconductor transistor.

In the embodiment of the present disclosure, a source electrode and a drain electrode of each transistor can be interchanged, so the source electrode and drain electrode of each transistor in the embodiment of the present disclosure are actually indistinguishable. Merely for distinguishing between two electrodes of a transistor other than a control electrode (that is, a gate electrode), one of the two electrodes is referred to as a drain electrode and the other a source electrode. The transistors used in the embodiment of the present disclosure can be N-type transistors or P-type transistors. When the transistors in the embodiment of the present disclosure are N-type transistors, the first electrode is a source electrode and the second electrode is a drain electrode. When the transistors used in the embodiment of the present disclosure are P-type transistors, the first electrode is a drain electrode and the second electrode is a source electrode. In the following embodiment, the transistors are described as N-type transistors, and a transistor is turned on when the signal received by its control electrode is at a high level. It can be understood that when the transistors used in the embodiment of the present disclosure are P-type transistors, the timing sequence of the driving signal needs to be adjusted accordingly. The specific details will not be elaborated, but it is also within the protection scope of the present disclosure.

The display, black insertion, and sensing of the sub-pixel rows of the display device are controlled by pixel circuits. The pixel circuits are driven by a gate driving circuit, and the gate driving circuit includes a plurality of cascaded shift registers.

In one embodiment, referring to FIG. 1, a pixel circuit includes a switching transistor T1, a driving transistor T2, a storage capacitor Cst, a sensing transistor T3, and a control node S. The first electrode of the switching transistor T1 is connected to a data signal terminal DATA for receiving a data signal provided by the data signal terminal DATA. The data signal can include a display data signal, a sensing data signal, and a black data signal. The second electrode of the switching transistor T1 is respectively connected to the control electrode of the driving transistor T2 and the first electrode plate of the storage capacitor Cst. The second electrode plate of the storage capacitor Cst is connected to the source electrode of the driving transistor T2. The control electrode of the switching transistor T1 is connected to a first scan driving signal output terminal G1 of the shift register. The first electrode of the driving transistor T2 is connected to the power supply voltage terminal ELVDD and receives the power supply voltage signal provided by the power supply voltage terminal ELVDD, and the second electrode of the driving transistor T2 is connected to the control node S. One end of the sub-pixels is connected to the control node S, and the other end of the sub-pixels is connected to the power supply voltage terminal ELVSS. The power supply voltage terminal ELVDD provides a high-level power supply signal, and the power supply voltage terminal ELVSS provides a low-level power supply signal. The first electrode of the sensing transistor T3 is connected to the control node S, and the second electrode of the sensing transistor T3 is connected to a sensing signal port SENSE. The control electrode of the sensing transistor T3 is connected to a second scan driving signal output terminal G2 of the shift register. One of the first electrode and the second electrode is a source electrode, and the other is a drain electrode. When the transistor is an N-type transistor, the first electrode is a drain electrode and the second electrode is a source electrode. When the transistor is a P-type transistor, the second electrode is a drain electrode and the first electrode is a source electrode. In the illustrated embodiment, the transistor is an N-type transistor.

Figure 2:
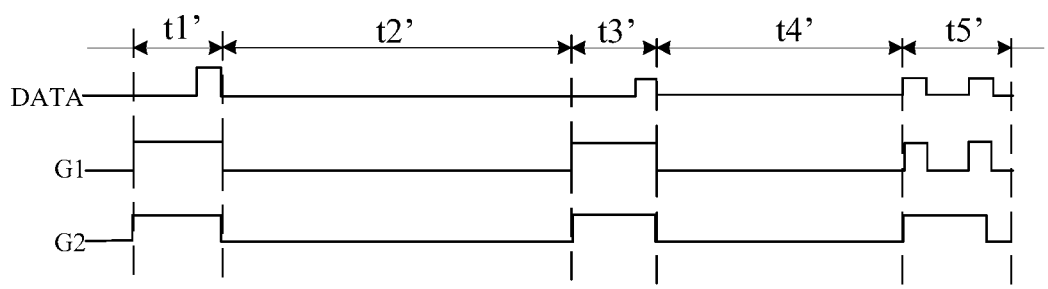
FIG. 2 is a driving timing sequence diagram of a pixel circuit according to the related art.

In the related art, when a certain row of sub-pixels needs to be externally compensated, the driving timing sequence of the pixel circuit of the display device is shown in FIG. 2. Referring to FIG. 2, during the display of one frame, the pixel circuit experiences five stages: a display data writing stage t1', a light emitting stage t2', a black data writing stage t3', a black data holding stage t4', and a sensing stage t5'.

In the display data writing stage t1', the first scan driving signal output terminal G1 and the second scan driving output terminal G2 of the shift register output a high level, the switching transistor T1 and the sensing transistor T3 are turned on, and the first electrode of the switching transistor T1 receives the display data signal provided by the data signal terminal DATA and writes the display data signal to the storage capacitor Cst.

In the light emitting stage t2', the first scan driving signal output terminal G1 and the second scan driving output terminal G2 of the shift register output a low level, the switching transistor T1 and the sensing transistor T3 are turned off, the storage capacitor Cst bootstraps, and the sub-pixels emit light.

In the black data writing stage t3', the first scan driving signal output terminal G1 and the second scan driving output terminal G2 output a high level, the switching transistor T1 and the sensing transistor T3 are turned on, the first electrode of the switching transistor T1 receives the black data signal provided by the data signal terminal DATA, and the black data signal is written into the storage capacitor Cst.

In the black data holding stage t4', the first scan driving signal output terminal G1 and the second scan driving signal output terminal G2 output a low level, the switching transistor T1 and the sensing transistor T3 are turned off, the driving transistor T2 is turned off, and the pixel stops emitting light.

In the sensing stage t5', the first scan driving signal output terminal G1 first outputs a high level, the second scan driving signal output terminal G2 outputs a high level, the switching transistor T1 and the sensing transistor T3 are turned on, the first electrode of the switching transistor T1 receives the sensing data signal provided by the data signal terminal DATA, and writes the sensing data signal into the storage capacitor Cst. Then, the first scan driving signal output terminal G1 outputs a low level, and the second scan driving signal output terminal G2 continues to output a high level, the switching transistor T1 is turned off, the driving transistor T2 is turned on, and the second electrode of the sensing transistor T3 outputs a pixel compensation signal. After that, the first scan driving signal output terminal G1 outputs a high level, and the second scan driving signal output terminal G2 continues to output a high level, the switching transistor T1 and the sensing transistor T3 are turned on, and the first electrode of the switching transistor T1 receives the black data signal provided by the data signal terminal DATA and writes the black data signal to the storage capacitor Cst. Then, the first scan driving signal is output terminal G1 and the second scan driving signal output terminal G2 output a low level, the driving transistor T3 is turned off, and the sub-pixels remain not emitting light.

Correspondingly, the process of driving the row of sub-pixels by the gate driving circuit includes a display driving stage, a black insertion driving stage, and a sensing driving stage. In the display driving stage, the gate driving circuit responds to a display control signal, and the first scan driving signal output terminal G1 of the gate driving circuit outputs the display driving signal; in the black insertion driving stage, the gate driving circuit responds to a black insertion control signal, and the first scan driving signal output terminal G1 of the gate driving circuit outputs a black insertion driving signal; in the sensing driving stage, the gate driving circuit first responds to a sensing control signal, and the first scan driving signal output terminal G1 of the gate driving circuit first outputs the sense driving signal and then outputs the black insertion driving signal. The gate driving circuit for driving the pixel circuit includes a plurality of shift registers, and each of the shift registers includes a display input circuit for receiving a display control signal, a black insertion input circuit for receiving a black insertion control signal, and a sensing input circuit for receiving a sensing control signal. That is, the shift register includes at least three input circuits, and the structure is relatively complicated.

It can be seen from the above that the driving process of the gate driving circuit in the related art is relatively complicated, and the structure of the gate driving circuit is also relatively complicated.

The embodiments of the present disclosure provide a shift register, a gate driving circuit and a driving method thereof, and a display device. The following describes in detail the shift register, the gate driving circuit and the driving method thereof, and the display device in the embodiments of the present disclosure with reference to the accompanying drawings. The features in the following embodiments can be mutually supplemented or combined with each other without conflict.

An embodiment of the present disclosure provides a driving method of a shift register. The driving method of a shift register is used for a shift register. The shift register is used to drive a pixel circuit.

Figure 3:
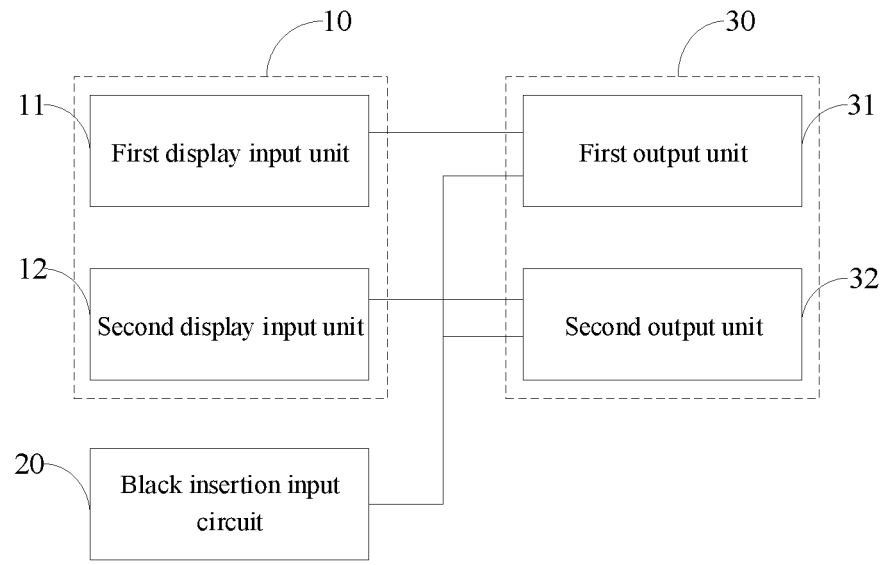
FIG. 3 is a block diagram of a shift register according to an example of the present disclosure.
Figure 4:
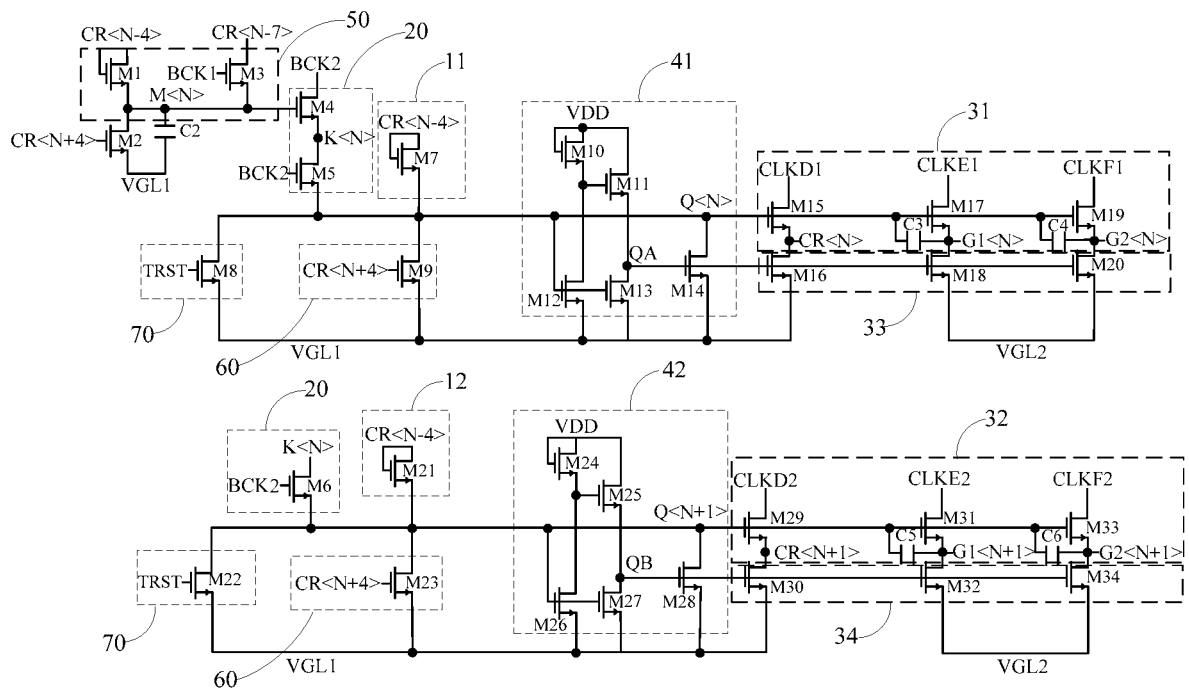
FIG. 4 is a circuit diagram of a shift register according to an example of the present disclosure.

Referring to FIGS. 3 and 4, the shift register includes a display input circuit 10, a black insertion input circuit 20 and an output circuit 30. The output circuit 30 is used to output a composite driving signal, and the composite driving signal includes a display driving signal, a first sense driving signal, a second sense driving signal, and a black insertion driving signal. During the display of one frame, the black insertion driving signal is output after the first sense driving signal and the second sense driving signal.

The display device where the shift register is disposed includes a display panel. The display panel includes a plurality of rows of sub-pixels and pixel circuits for driving the sub-pixels. Each shift register can be used to drive a pixel circuit of one row of sub-pixels, or pixel circuits of two adjacent rows of sub-pixels. During display of one frame, only one row of sub-pixels needs to be sensed, that is, only detecting a pixel compensation signal on one row of sub-pixels.

For the sub-pixel row to be sensed, the driving method of the shift register includes the following processes.

In the display driving period, the display input circuit, in response to a display control signal, causes the output circuit to output the display driving signal, so that the control electrode of the switching transistor receives the display driving signal to turn on the switching transistor, the first electrode of the switching transistor receives a display data signal, and the sub-pixels emit light.

In the black insertion driving period, the black insertion input circuit, in response to a black insertion control signal, causes the output circuit to first output a first sense driving signal and a second sense driving signal, so that the control electrode of the switching transistor receives the first sense driving signal to turn on the switching transistor, the first electrode of the switching transistor receives the sensing data signal, and the control electrode of the sensing transistor receives the second sense driving signal to turn on the sensing transistor, and the second electrode of the sensing transistor outputs a pixel compensation signal, and at the same time the sub-pixels stop emitting light; then the output circuit outputs a black insertion driving signal, and the pixel circuit receives the black insertion driving signal to turn off the driving transistor, and the sub-pixels remain not emitting light.

In the driving method of a shift register according to the embodiment of the application, in the black insertion driving stage, the black insertion input circuit of the shift register responds to a black insertion control signal, and the output circuit first outputs a first sense driving signal and a second sense driving signal then outputs a black insertion driving signal. The pixel circuit detects the pixel compensation signal while driving the sub-pixels to not emit light. That is, the shift register can drive the pixel circuit to realize the detection of black insertion and sub-pixel compensation signals during the black insertion driving stage, so there is no need to provide a sensing driving period in the driving process of the shift register, which can simplify the driving process of the shift register and simplify the driving timing sequence. Accordingly, there is no need to provide a sense driving signal to the shift register, and the shift register can do without a sensing input circuit, which can simplify the circuit of the shift register. The detection of the pixel compensation signal is completed in the black insertion driving stage, the sub-pixels do not emit light during the detection of the pixel compensation signal, and after the detection of the pixel compensation signal is completed, the pixel circuit receives the black insertion driving signal to turn off the driving transistor and the sub-pixels remain not emitting light. Therefore, the display device will not have regular black streaks during the detection of the pixel compensation signal, and the display effect of the display device will not be affected.

Figure 5:
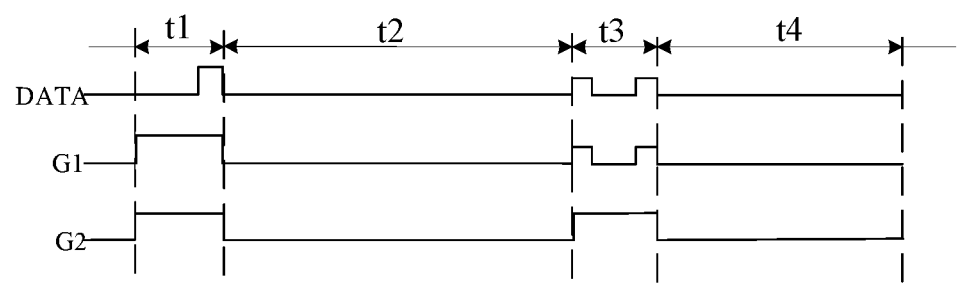
FIG. 5 is a driving timing sequence diagram of a pixel circuit according to an example of the present disclosure.

Referring to FIG. 5, for the sub-pixel row to be sensed, during the display of one frame, the driving timing sequence of the pixel circuit includes a display data writing stage t1, a light emitting stage t2, a black insertion stage t3, and a black data holding stage t4.

In the data writing stage t1, the display driving signal output by the first scan driving signal output terminal G1 of the output circuit is at a high level, and the control electrode of the switching transistor T1 of the pixel circuit receives the display driving signal output by the first scan driving signal output terminal G1 to turn on the switching transistor T1. Then the first electrode of the switching transistor T1 receives the display data signal provided by the data signal terminal DATA, and writes the display data signal into the storage capacitor Cst. In some implementations, in the data writing stage t11, the second scan driving signal output terminal G2 of the output circuit can simultaneously output an auxiliary driving signal, and the auxiliary driving signal output by the second scan driving signal output terminal G2 is at a high level. The control electrode of the sensing transistor T2 receives the auxiliary driving signal output from the second scan driving signal output terminal G2 to turn on the sensing transistor T2.

In the light emitting stage t2, the signals output by the first scan driving signal output terminal G1 and the second scan driving signal output terminal G2 of the output circuit are both at a low level, the switching transistor T1 and the sensing transistor T2 are turned off, the storage capacitor Cst bootstraps, and the sub-pixels start to emit light.

In the black insertion stage t3, the first scan driving signal output terminal G1 and the second scan driving signal output terminal G2 of the output circuit first output a first sense driving signal and a second sense driving signal, and the control electrode of the switching transistor T1 receives the first sense driving signal to turn on the switching transistor T1, the control electrode of the sensing transistor T3 receives the second sense driving signal to turn on the sensing transistor T3, and the first electrode of the switching transistor T1 receives the sensing data signal provided by the data signal terminal DATA, and write the sensing data signal into the storage capacitor Cst. Then the first scan driving signal output terminal G1 of the output circuit outputs a low level signal, the second scan driving signal output terminal G2 continues to output a high level signal, the switching transistor T1 is turned off, the sensing transistor T3 remains turned on, and the storage capacitor Cst bootstraps. The second electrode of the sensing transistor T3 outputs a pixel compensation signal; in this process, since the current flowing into the sub-pixels is small, the sub-pixels stop emitting light. Subsequently, the first scan driving signal output terminal G1 and/or the second scan driving signal output terminal G2 of the output circuit output a black insertion driving signal, the pixel circuit receives the black insertion driving signal to turn off the driving transistor, and the pixel remains not emitting light.

In an implementation, for sub-pixel rows that do not need to be sensed, the driving method of a shift register includes the following periods.

In the display driving period, the display input circuit, in response to a display control signal, causes the output circuit to output the display driving signal, so that the control electrode of the switching transistor receives the display driving signal to turn on the switching transistor, the first electrode of the switching transistor receives a display data signal, and the pixels emit light.

In the black insertion driving period, the black insertion input circuit, in response to a black insertion control signal, causes the output circuit to output a black insertion driving signal, the pixel circuit receives the black insertion driving signal to turn off the driving transistor, and the sub-pixels do not emit light. Specifically, after the pixel circuit receives the black insertion driving signal, the pixel circuit writes a black data signal to the storage capacitor, so that the driving transistor is turned off.

In one implementation, the black insertion driving signal includes a first black insertion driving signal output by the first scan driving signal output terminal G1, and the black data signal includes a first black data signal provided by the data signal terminal DATA. In the black insertion driving stage, the output circuit outputs a black insertion driving signal. The pixel circuit receiving the black insertion driving signal to turn off the driving transistor includes the following processes.

The output circuit outputs a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor.

Specifically, the first black insertion driving signal output by the first scan driving signal output terminal G1 of the output circuit is at a high level, and the control electrode of the switching transistor T1 receives the first black insertion driving signal to turn on the switching transistor T1. Then the first electrode of the switching transistor T1 receives the first black insertion data signal provided by the data signal terminal DATA and writes the first black insertion data signal into the storage capacitor Cst. Then, the first scan driving signal output terminal G1 of the output circuit outputs a low level, and the switching transistor T1 is turned off. The magnitude of the first black data signal provided by the data signal terminal DATA can be controlled so that the voltage difference $V_{GS}$ between the gate electrode and the source electrode of the driving transistor T2 is smaller than the threshold voltage Vth of the driving transistor T2, and the driving transistor T2 is turned off. In some implementations, the voltage of the first black data signal can be zero.

In another implementation, the black insertion driving signal includes a first black insertion driving signal output from the first scan driving signal output terminal G1 and a second black insertion driving signal output from the second scan driving signal output terminal G2. The black data signal includes a first black data signal provided by the data signal terminal DATA and a second black data signal provided by the sensing signal port SENSE. In the black insertion driving stage, the output circuit outputs the black insertion driving signal. The pixel circuit receiving the black insertion driving signal to turn off the driving transistor includes the following processes.

The output circuit outputs the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor. The second electrode of the sensing transistor receives the second black data signal and writes the second black data signal into the storage capacitor, so that the driving transistor is turned off.

Specifically, the first black insertion driving signal output by the first scan driving signal output terminal G1 of the output circuit and the second black insertion driving signal output by the second scan driving signal output terminal G2 are both at a high level, and the control electrode of the switching transistor T1 receives the first black insertion driving signal to turn on the switching transistor T1, the control electrode of the sensing transistor T3 receives the second black insertion driving signal to turn on the sensing transistor T3, and the first electrode of the switching transistor T1 receives the first black data signal and writes the first black data signal into the storage capacitor Cst, the second electrode of the sensing transistor T3 receives the second black data signal and writes the first black data signal into the storage capacitor Cst. Subsequently, the first scan driving signal output terminal G1 and the second scan driving signal output terminal G2 of the output circuit both output a low level, and the switching transistor T1 and the sensing transistor T3 are turned off. At this time, the voltage of the storage capacitor Cst is equal to the $V_{GS}$ of the driving transistor T2. By controlling the magnitude of the first black data signal and the second black data signal, the $V_{GS}$ of the driving transistor T2 is smaller than the threshold voltage Vth of the driving transistor T2, so that the driving transistor T2 is turned off.

In another implementation, the black insertion driving signal includes a second black insertion driving signal output from the second scan driving signal output terminal G2, and the black data signal includes a second black data signal provided by a sensing signal port SENSE. In the black insertion driving stage, the output circuit outputs a black insertion driving signal. The pixel circuit receiving the black insertion driving signal to turn off the driving transistor includes the following processes.

The output circuit outputs a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

Specifically, the second black insertion driving signal output by the second scan driving signal output terminal G2 of the output circuit is at a high level, and the control electrode of the sensing transistor T3 receives the second black insertion driving signal to turn on the sensing transistor T3. Then, the second electrode of the sensing transistor T3 receives the second black data signal and writes the second black data signal into the storage capacitor Cst. Subsequently, the second scan driving signal output terminal G2 of the output circuit outputs a low level, and the sensing transistor T3 is turned off. The magnitude of the second black data signal can be controlled so that the voltage at the source electrode of the driving transistor T2 is greater than the voltage at the gate electrode, so that the $V_{GS}$ of the driving transistor T2 is smaller than the threshold voltage Vth of the driving transistor T2, and the driving transistor T2 is turned off.

An embodiment of the present disclosure also provides a shift register, and the shift register is used to implement the driving method of a shift register described in any of the foregoing embodiments. 3 and 4, the shift register includes a display input circuit 10, a black insertion input circuit 20, a pull-up node, and an output circuit 30.

The output terminal of the black insertion input circuit 20 and the output terminal of the display input circuit 10 are respectively connected to the pull-up node to charge the pull-up node. The control terminal of the output circuit 30 is connected to the pull-up node, and the input terminal of the output circuit 30 is connected to a clock signal terminal.

When the sub-pixel row corresponding to the pixel circuit driven by the shift register is to be sensed, in the display driving period, the display input circuit 10 charges the pull-up node in response to a display control signal, and under the control of the pull-up node, the output terminal of the output circuit 30 outputs a display driving signal. In the black insertion driving period, the black insertion input circuit 20 charges the pull-up node in response to a black insertion control signal, and under the control of the pull-up node, the output terminal of the output circuit 30 first outputs a first sense driving signal and a second sense driving signal, and then outputs a black insertion driving signal.

When the sub-pixel row corresponding to the pixel circuit driven by the shift register does not need to be sensed, in the display driving period, the display input circuit 10 charges the pull-up node in response to a display control signal, and under the control of the pull-up node, the output terminal of the output circuit 30 outputs a display driving signal. In the black insertion driving period, the black insertion input circuit 20 charges the pull-up node in response to a black insertion control signal, and under the control of the pull-up node, the output terminal of the output circuit 30 outputs a black insertion driving signal.

In the shift register provided by the embodiment of the application, when the sub-pixel row corresponding to the pixel circuit driven by the shift register needs to be sensed, in the black insertion driving stage, the black insertion input circuit of the shift register responds to a black insertion control signal, and the output circuit first outputs a first sense driving signal and a second sense driving signal. The pixel circuit detects the pixel compensation signal while driving the sub-pixels to not emit light. That is, the shift register can drive the pixel circuit to realize the detection of black insertion and sub-pixel compensation signals during the black insertion driving stage, so there is no need to provide a sense driving signal to the shift register, and the shift register can do without a sensing input circuit, which can simplify the circuit of the shift register. Accordingly, there is no need to provide a sensing driving period in the driving process of the shift register, which can simplify the driving process of the shift register and simplify the driving timing sequence. The detection of the pixel compensation signal is completed in the black insertion driving stage, the sub-pixels do not emit light during the detection of the pixel compensation signal, and after the detection of the pixel compensation signal is completed, the pixel circuit receives the black insertion driving signal to turn off the driving transistor and the sub-pixels remain not emitting light. Therefore, the display device will not have regular black streaks during the detection of the pixel compensation signal, and the display effect of the display device will not be affected.

In one implementation, the output circuit 30 includes a first output unit 31 and a second output unit 32; the display input circuit 10 includes a first display input unit 11 and a second display input unit 12; and the pull-up node includes a first pull-up node Q<N> and a second pull-up node Q<N+1>. The output terminal of the black insertion input circuit 20 is respectively connected to the first pull-up node Q<N> and the second pull-up node Q<N+1>. The output terminal of the first display input unit 11 is connected to the first pull-up node Q<N>, and the control terminal of the first output unit 31 is connected to the first pull-up node Q<N>. The output terminal of the second display input unit 12 is connected to the second pull-up node Q<N+1>, and the control terminal of the second output unit 32 is connected to the second pull-up node Q<N+1>. The first output unit 31 and the second output unit 32 respectively output composite driving signals for driving sub-pixels in different rows. In this way, one shift register can output a composite driving signal for driving two rows of sub-pixels, which can reduce the number of shift registers in the display device and simplify the circuit complexity of the display device.

In one implementation, the first display input unit 11 includes a seventh transistor M7. The control electrode and the first electrode of the seventh transistor M7 are respectively connected to shift signal output terminals CR<N−4> of other shift registers, and the second electrode of the seven transistor M7 is connected to the first pull-up node Q<N>. The display control signal includes the shift signal provided by the shift signal output terminal CR<N−4>.

In one implementation, the second display input unit 12 includes a twenty-first transistor M21. The control electrode and the first electrode of the twenty-first transistor M21 are respectively connected to shift signal output terminals CR<N−4> of other shift registers, and the second electrode of the twenty-first transistor M21 is connected to the second pull-up node Q<N+1>.

In one implementation, the shift register further includes a black insertion pre-charging circuit 50 and a black insertion control node M<N>, and the output terminal of the black insertion pre-charging circuit 50 is connected to the black insertion control node M<N>, the black insertion pre-charging circuit 50 is used to charge the black insertion control node M<N>. The control terminal of the black insertion input circuit 20 is connected to the black insertion control node M<N>; the output terminal of the black insertion input circuit 20 is respectively connected to the first pull-up node Q<N> and the second pull-up node Q<N+1>.

The black insertion control signal includes the potential at the black insertion control node M<N> and the black insertion input signal. The black insertion input circuit 20, in response to the potential at the pull-up control node M<N> and a black insertion input signal, charges the first pull-up node Q<N> and the second pull-up node Q<N+1>.

In one implementation, the black insertion pre-charging circuit 50 includes a first transistor M1 and a third transistor M3. The control electrode and the first electrode of the first transistor M1 are respectively connected to the shift signal output terminals CR<N−4> of other shift registers, and the second electrode of the first transistor M1 is connected to the black insertion control node M<N>. The control electrode of the third transistor M3 is connected to the clock signal terminal BCK1, the first electrode of the third transistor M3 is connected to the shift signal output terminals CR<N−7> of other shift registers, and the second electrode of the third transistor M3 is connected to the black insertion control node M<N>. In the display driving stage, the black insertion pre-charging circuit 50, in response to a display control signal provided by the shift signal output terminal CR<N−4> and charges the pull-up control node M<N>. In the black insertion driving stage, the black insertion pre-charging circuit 50, in response to a black insertion pre-charging control signal provided by the mobile signal output terminal CR<N−7> and charges the black insertion control node M<N>.

In one implementation, the black insertion input circuit 20 includes a fourth transistor M4, a fifth transistor M5, and a sixth transistor M6. The control electrode of the fourth transistor M4 is connected to the black insertion control node M<N>, the first electrode of the fourth transistor M4 is connected to the clock signal terminal BCK2, and the second electrode of the fourth transistor M4 is connected to the black insertion pull-up node K<N>. The first electrode of the fifth transistor M5 is connected to the black insertion pull-up node K<N>, the control electrode of the fifth transistor M5 is connected to the clock signal terminal BCK2, and the second electrode of the fifth transistor M5 is connected to the first pull-up node Q<N>. The control electrode of the sixth transistor M6 is connected to the clock signal terminal BCK2, the first electrode of the sixth transistor M6 is connected to the black insertion pull-up node K<N>, and the second electrode of the sixth transistor M6 is connected to the second pull-up node Q<N+1>. The black insertion input signal is the clock signal provided by the clock signal terminal BCK2.

In one implementation, the shift register can further include a second transistor M2 and a capacitor C2. The control electrode of the second transistor M2 is connected to the shift signal output terminal CR<N+4>, and the first electrode of the second transistor M2 is connected to the black insertion control node M<N>, and the second electrode of the second transistor M2 is connected to the first power supply terminal VGL1. The two electrodes plates of the capacitor C2 are respectively connected to the black insertion control node M<N> and the first power supply terminal VGL1. The first power supply terminal VGL1 is a low-level power supply terminal. The second transistor M2 responds to a row reset signal provided by the shift signal output terminal CR<N+4> to pull down and reset the black insertion control node M<N>. The capacitor C2 maintains the potential at the black insertion control node M<N> stable.

In one implementation, the first output unit 31 includes three output terminals, which are respectively a shift signal output terminal CR<N>, a first scan driving signal output terminal G1<N>, and a second scan driving signal output terminal G2<N>. The shift signal output terminal CR<N> outputs a shift signal, and the first scan driving signal output terminal G1<N> outputs a display driving signal, a first sense driving signal and a first black insertion driving signal for the pixel circuit corresponding to the Nth row of sub-pixels, the second scan driving signal output terminal G2<N> outputs an auxiliary driving signal, a second sense driving signal, and a second black insertion driving signal for the pixel circuit corresponding to the Nth row of sub-pixels.

In one implementation, the first output unit 31 includes a fifteenth transistor M15, a seventeenth transistor M17, a nineteenth transistor M19, a capacitor C2, and a capacitor C3. The control electrode of the fifteenth transistor M15, the control electrode of the seventeenth transistor M17, and the control electrode of the nineteenth transistor M19 are respectively connected to the first pull-up node Q<N>. The first electrode of the fifteenth transistor M15 is connected to the clock signal terminal CLKD1, and the second electrode of the fifteenth transistor M15 is connected to the shift signal output terminal CR<N>. The first electrode of the seventeenth transistor M17 is connected to the clock signal terminal CLKE1, and the second electrode of the seventeenth transistor M17 is connected to the first scan driving signal output terminal G1<N>. The first electrode of the nineteenth transistor M19 is connected to the clock signal terminal CLKF1, and the second electrode of the nineteenth transistor M19 is connected to the second scan driving signal output terminal G2<N>. The two electrode plates of the capacitor C2 are respectively connected to the first pull-up node Q<N> and the first scan driving signal output terminal G1<N>. The two electrode plates of the capacitor C3 are respectively connected to the first pull-up node Q<N> and the second scan driving signal output terminal G2<N>. The signal provided by the clock signal terminal CLKD1 includes a shift signal. The signal provided by the clock signal terminal CLKE1 includes the display driving signal, the first sense driving signal, and the first black insertion driving signal for the pixel circuit corresponding to the Nth row of sub-pixels. The signal provided by the clock signal terminal CLKF1 includes an auxiliary driving signal, a second sense driving signal, and a second black insertion driving signal for the pixel circuit corresponding to the Nth row of sub-pixel. The capacitor C2 and the capacitor C3 are used to maintain the potential at the first pull-up node Q<N> stable.

In one implementation, the second output unit 32 includes three output terminals, which are respectively the shift signal output terminal CR<N+1>, the first scan driving signal output terminal G1<N+1>, and the second scan driving signal output terminal G2<N+1>. The shift signal output terminal CR<N+1> outputs a shift signal, and the first scan driving signal output terminal G1<N+1> outputs a display driving signal, a first sense driving signal and a first insertion black driving signal for the pixel circuit corresponding to the (N+1)th row of sub-pixels. The second scan driving signal output terminal G2<N+1> outputs an auxiliary driving signal, a second sense driving signal, and a second black insertion driving signal for the pixel circuit corresponding to the (N+1)th row of sub-pixels.

In one implementation, the second output unit 32 includes a twenty-ninth transistor M29, a thirty-first transistor M31, a thirty-third transistor M33, a capacitor C5, and capacitor C6. The control electrode of the twenty-ninth transistor M29, the control electrode of the thirty-first transistor M31, and the control electrode of the thirty-third transistor M33 are respectively connected to the second pull-up node Q<N+1>. The first electrode of the twenty-ninth transistor M29 is connected to the clock signal terminal CLKD2, and the second electrode of the twenty-ninth transistor M29 is connected to the shift signal output terminal CR<N+1>. The first electrode of the thirty-first transistor M31 is connected to the clock signal terminal CLKE2, and the second electrode of the thirty-first transistor M31 is connected to the first scan driving signal output terminal G1<N+1>. The first electrode of the thirty-third transistor M33 is connected to the clock signal terminal CLKF2, and the second electrode of the thirty-third transistor M33 is connected to the second scan driving signal output terminal G2<N+1>. The two electrode plates of the capacitor C5 are respectively connected to the second pull-up node Q<N+1> and the first scan driving signal output terminal G1<N+1>. The two electrode plates of the capacitor C6 are respectively connected to the second pull-up node Q<N+1> and the second scan driving signal output terminal G2<N+1>. The signal provided by the clock signal terminal CLKD2 includes a shift signal. The signal provided by the clock signal terminal CLKE2 includes a display driving signal, a first sense driving signal, and a first black insertion driving signal for the pixel circuit corresponding to the (N+1)th row of sub-pixels. The signal provided by the clock signal terminal CLKF2 includes an auxiliary driving signal, a second sense driving signal, and a second black insertion driving signal for the pixel circuit corresponding to the (N+1)th row of sub-pixels. The capacitor C5 and the capacitor C6 are used to maintain the potential at the second pull-up node Q<N+1> stable.

In one implementation, the shift register further includes a pull-down control circuit 40 and a pull-down node. The output circuit 30 also includes a pull-down circuit. The pull-down control circuit 40 is used to control the level of the pull-down node, and the pull-down circuit responds to the level of the pull-down node to pull down and reset the pull-up node and the output terminal of the output circuit.

In one implementation, the pull-down control circuit 40 further includes a first pull-down control unit 41 and a second pull-down control unit 42. The drop-down node includes a first drop-down node QA and a second drop-down node QB. The first pull-down control unit 41 is used to control the level of the first pull-down node QA. The second pull-down control unit 42 is used to control the level of the second pull-down node QB.

In one implementation, the first pull-down control unit 41 includes a tenth transistor M10, an eleventh transistor M11, a twelfth transistor M12, a thirteenth transistor M13, and a fourteenth transistor M14. The control electrode and the first electrode of the tenth transistor M10 are respectively connected to the second power supply terminal VDD, and the second electrode of the tenth transistor M10 is connected to the control electrode of the eleventh transistor M11. The first electrode of the eleventh transistor M11 is connected to the second power supply terminal VDD, and the second electrode of the eleventh transistor M11 is connected to the first pull-down node QA. The control electrode of the twelfth transistor M12 is connected to the first pull-up node Q<N>, the first electrode of the twelfth transistor M12 is connected to the second electrode of the tenth transistor M10, and the second electrode of the twelfth transistor M12 is connected to the first power supply terminal VGL1. The control electrode of the thirteenth transistor M13 is connected to the first pull-up node Q<N>, the first electrode of the thirteenth transistor M13 is connected to the first pull-down node QA, and the second electrode of the thirteenth transistor M13 is connected to the first power supply terminal VGL1. The control electrode of the fourteenth transistor M14 is connected to the first pull-down node QA, the first electrode of the fourteenth transistor M14 is connected to the first pull-up node Q<N>, and the second electrode of the fourteenth transistor M14 is connected to the first power supply terminal VGL1. The first pull-down control unit 41 controls the level of the first pull-down node QA under the control of the level of the first pull-up node Q<N>. When the first pull-up node Q<N> is at a high level, the first pull-down node QA is at a low level; and when the first pull-up node Q<N> is at a low level and the second power supply terminal VDDw is at a high level, the first pull-down node QA is at a high level.

In one implementation, the second pull-down control unit 42 includes a twenty-fourth transistor M24, a twenty-fifth transistor M25, a twenty-sixth transistor M26, a twenty-seventh transistor M27, and a twenty-eighth transistor M28. The control electrode and the first electrode of the twenty-fourth transistor M24 are respectively connected to the second power supply terminal VDD, and the second electrode of the twenty-fourth transistor M24 is connected to the control electrode of the twenty-fifth transistor M25. The first electrode of the twenty-fifth transistor M25 is connected to the second power supply terminal VDD, and the second electrode of the twenty-fifth transistor M25 is connected to the second pull-down node QB. The control electrode of the twenty-sixth transistor M26 is connected to the second pull-up node Q<N+1>. The first electrode of the twenty-sixth transistor M26 is connected to the second electrode of the twenty-fourth transistor M24. The second electrode of the transistor M26 is connected to the first power supply terminal VGL1. The control electrode of the twenty-seventh transistor M27 is connected to the second pull-up node Q<N+1>, the first electrode of the twenty-seventh transistor M27 is connected to the second pull-down node QB, and the second electrode of the twenty-seventh transistor M27 is connected to the first power supply terminal VGL1. The control electrode of the twenty-eighth transistor M28 is connected to the second pull-down node QB, the first electrode of the twenty-eighth transistor M28 is connected to the second pull-up node Q<N+1>, and the second electrode of the twenty-eighth transistor M28 is connected to the first power supply terminal VGL1. The second pull-down control unit 42 controls the level of the second pull-down node QB under the control of the level of the second pull-up node Q<N+1>. When the second pull-up node Q<N+1> is at a high level, the second pull-down node QB is at a low level; and when the second pull-up node Q<N+1> is at a low level and the second power supply terminal VDDw is at a high level, the second pull-down node QB is at a high level.

In one implementation, the pull-down circuit includes a first pull-down unit 33 and a second pull-down unit 34. The first pull-down unit 33 resets the first pull-up node Q<N> and the output terminal of the first output unit under the control of the level of the first pull-down node QA. The second pull-down unit 34 resets the second pull-up node Q<N+1> and the output terminal of the second output unit under the control of the level of the second pull-down node QB.

In one implementation, the first pull-down unit 33 includes a sixteenth transistor M16, an eighteenth transistor M18, and a twentieth transistor M20. The control electrode of the sixteenth transistor M16, the control electrode of the eighteenth transistor M18, and the control electrode of the twentieth transistor M20 are respectively connected to the first pull-down node QA. The first electrode of the sixteenth transistor M16 is connected to the shift signal output terminal CR<N>, and the second electrode of the sixteenth transistor M16 is connected to the first power supply terminal VGL1. The first electrode of the eighteenth transistor M18 is connected to the first scan driving signal output terminal G1<N>, and the second electrode of the eighteenth transistor M18 is connected to the third power supply terminal VGL2. The first electrode of the twentieth transistor M20 is connected to the second scan driving signal output terminal G2<N>, and the second electrode of the twentieth transistor M20 is connected to the third power supply terminal VGL2. The third power supply terminal VGL2 is a low-level power supply terminal.

In one implementation, the second pull-down unit 34 includes a thirtieth transistor M30, a thirty-second transistor M32, and a thirty-fourth transistor M34. The control electrode of the thirtieth transistor M30, the control electrode of the thirty-second transistor M32, and the control electrode of the thirty-fourth transistor M34 are respectively connected to the second pull-down node QB. The first electrode of the thirtieth transistor M30 is connected to the shift signal output terminal CR<N+1>, and the second electrode of the thirtieth transistor M30 is connected to the first power supply terminal VGL1. The first electrode of the thirty-second transistor M32 is connected to the first scan driving signal output terminal G1<N+1>, and the second electrode of the thirty-second transistor M32 is connected to the third power supply terminal VGL2. The first electrode of the thirty-fourth transistor M34 is connected to the second scan driving signal output terminal G2<N+1>, and the second electrode of the thirty-fourth transistor M34 is connected to the third power supply terminal VGL2.

In one implementation, the shift register further includes a row reset circuit 60, and the row reset circuit resets the pull-up node in response to a row reset signal provided by the shift signal output terminal CR<N+4>.

In one implementation, the row reset circuit 60 includes a ninth transistor M9 and a twenty-third transistor M23. The control electrode of the ninth transistor M9 is connected to the shift signal output terminal CR<N+4>, the first electrode of the ninth transistor M9 is connected to the first pull-up node Q<N>, and the second electrode of the ninth transistor M9 is connected to the first power supply terminal VGL1. The control electrode of the twenty-third transistor M23 is connected to the shift signal output terminal CR<N+4>, the first electrode of the twenty-third transistor M23 is connected to the second pull-up node Q<N+1>, and the second electrode of the twenty-third transistor M23 is connected to the first power supply terminal VGL1.

In an implementation, the shift register further includes a global reset circuit 70, and the global reset circuit 70 resets the pull-up node in response to a global reset signal provided by a global reset output terminal TRST.

In one implementation, the global reset circuit 70 includes an eighth transistor M8 and a twenty-second transistor M22. The control electrode of the eighth transistor M8 is connected to the global reset output terminal TRST, the first electrode of the eighth transistor M8 is connected to the first pull-up node Q<N>, and the second electrode of the eighth transistor M8 is connected to the first power supply terminal VGL1. The control electrode of the twenty-second transistor M22 is connected to the global reset output terminal TRST, the second electrode of the twenty-second transistor M22 is connected to the second pull-up node Q<N+1>, and the second electrode of the twenty-second transistor M22 is connected to the first power supply terminal VGL1.

An embodiment of the present disclosure also provides a gate driving circuit. The gate driving circuit includes a plurality of cascaded shift registers, and the shift register is the shift register described in any one of the foregoing implementations.

In one implementation, the control circuit of each shift register includes a first output unit and a second output unit, and each shift register is used to drive pixel circuits corresponding to two adjacent rows of sub-pixels.

Figure 6:
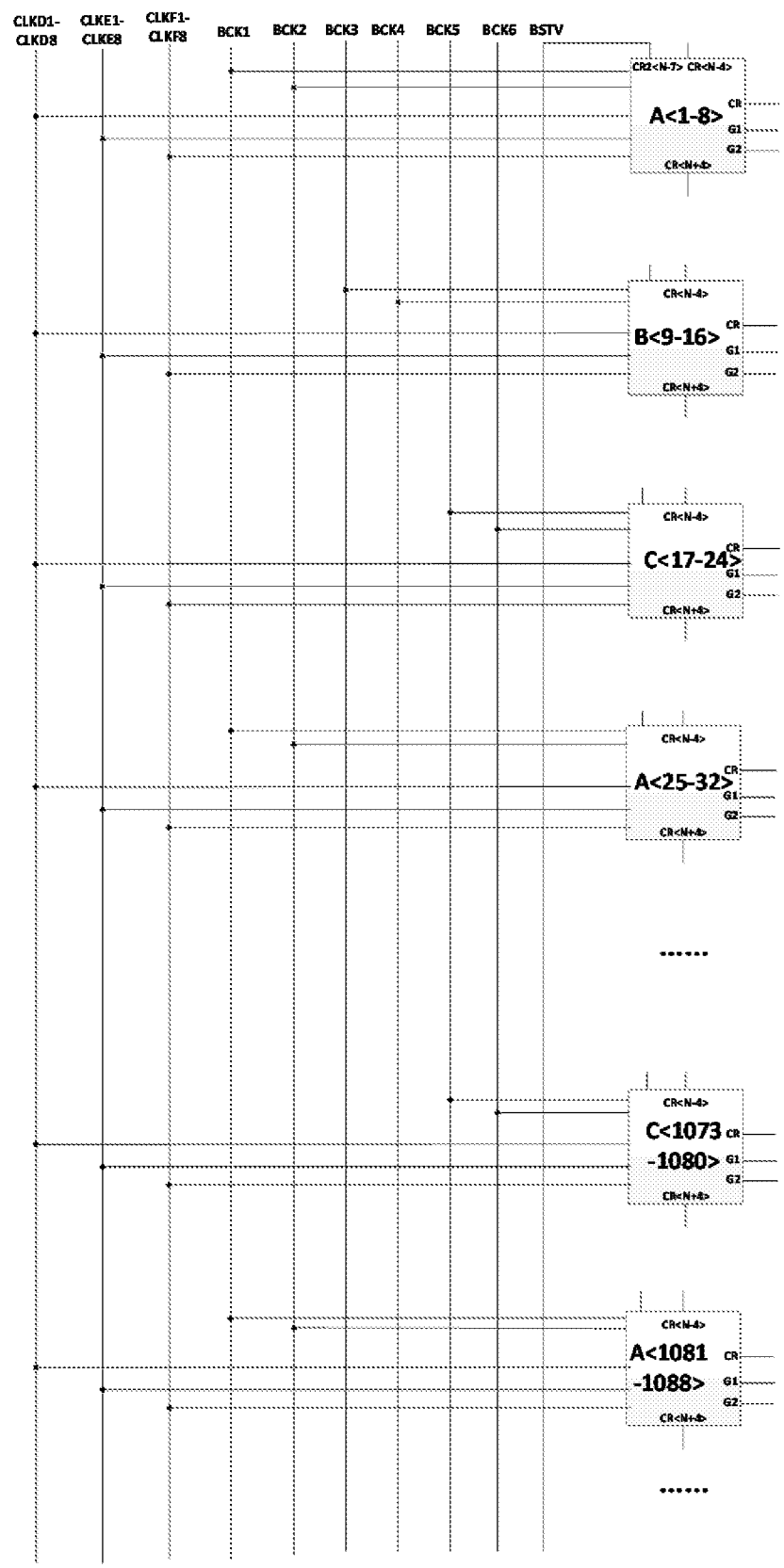
FIG. 6 is a schematic structural diagram of a gate driving circuit according to an example of the present disclosure.

In one implementation, referring to FIG. 6, the gate driving circuit includes clock signal lines CLKD1~CLKD8, CLKE1~CLKE8, CLKF1~CLKF8, and BCK1~BCK6.

Shift registers (four shift registers) corresponding to eight adjacent rows of sub-pixels of shift registers of the gate driving circuit are grouped as a shift register unit, and each shift register unit is connected to CLKE1~CLKE8 and CLKF1~CLKF8 respectively. Among the eight sub-pixel rows corresponding to each shift register unit, the shift register corresponding to the first sub-pixel row and the second sub-pixel row has a first output unit connected to CLKD1, CLKE1, and CLKE1, and a second output unit connected to CLKD2, CLKE2 and CLKE2; the shift register corresponding to the third sub-pixel row and the fourth sub-pixel row has a first output unit connected to CLKD3, CLKE3, and CLKE3, and a second output unit connected to CLKD4, CLKE4, and CLKE4; the shift register corresponding to the fifth sub-pixel row and the sixth sub-pixel row has a first output unit connected to CLKD5, CLKE5, and CLKE5, and a second output unit connected to CLKD6, CLKE6, and CLKE6; the shift register corresponding to the seventh sub-pixel row and the eighth sub-pixel row has a first output unit connected to CLKD7, CLKE7, and CLKE7, and a second output unit connected to CLKD8, CLKE8, and CLKE8. The shift register unit A<1-8> of the display device corresponds to the first row to the eighth row of sub-pixels, the first sub-pixel row is the first row of sub-pixels, and the second sub-pixel row is the second row of sub-pixels; and so on, the eighth sub-pixel row is the eighth row of sub-pixels; the shift register unit B<9-16> of the display device corresponds to the ninth row to the sixteenth row of sub-pixels, and the first sub-pixel row is the ninth row of sub-pixels, the second sub-pixel row is the tenth row of sub-pixels . . . the eighth sub-pixel row is the sixteenth row of sub-pixels. The connection relationship between the shift register units C<17-24>, A<25-32> . . . C<1073-1080>, A<1081-1088> and the clock signal line is the same as the above-mentioned connection relationship.

Each shift register is connected to two BCK signal lines, and the BCK signal lines connected to the shift registers of the same shift register unit are the same. Three adjacent shift register units are a cyclic unit. Among the three shift register units of a cyclic unit, the shift registers of one shift register unit are connected to BCK1 and BCK2, the shift registers of one shift register unit is connected to BCK3 and BCK4, and the shift registers of the other shift register unit are connected to BCK5 and BCK6 respectively. For example, the shift registers of the shift register unit A<1-8> are connected to BCK1 and BCK2, the shift registers of the shift register unit B<9-16> are connected to BCK3 and BCK4, and the shift registers of the shift register unit C<17-24> are connected to BCK5 and BCK6 respectively. The shift registers of other cyclic units repeat the above-mentioned connection relationship.

The gate driving circuit further includes a black insertion start signal line BSTV. The shift signal output terminals CR<N-7> of the shift registers in the shift register unit A<1-8> are respectively connected to a black insertion start signal line BSTV.

An embodiment of the present disclosure also provides a driving method of a gate driving circuit, and the driving method of the gate driving circuit is used in the gate driving circuit described in the above-mentioned embodiment. The display period of one frame of picture includes a first sub-period and a second sub-period, and the gate driving circuit includes n shift registers.

The driving method of the gate driving circuit includes the following processes.

In the first sub-period, the 1st stage to the mth stage shift registers are controlled to be in the display driving stage; the (m+1)th stage to the nth stage shift register are controlled to be in the black insertion driving stage, and one of the shift registers of the (m+1)th stage shift register to the nth stage shift register are controlled to first output a first sense driving signal and a second sense driving signal, and then output a black insertion driving signal and other shift registers are controlled to output only the black insertion driving signal; where m>1, m+1<n, and both m and n are positive integers.

In the second sub-period, the 1st stage to the mth stage shift registers are controlled to be in the black insertion driving stage; one of the shift registers of the first stage shift register to the mth stage shift register are controlled to first output a first sense driving signal and a second sense driving signal, and then output a black insertion driving signal and other shift registers are controlled to output only the black insertion driving signal; the (m+1)th stage to the nth stage shift registers are controlled to be in the display driving stage.

The first sub-period can be before the second sub-period, or the first sub-period can be after the second sub-period.

With the above-mentioned driving method of the gate driving circuit, during the display period of part of the sub-pixel rows of the display device, black insertion is performed for the remaining sub-pixel rows, and a certain sub-pixel row is sensed during the black insertion. It can shorten the response time of the motion pictures of the display device and enhance detection of the pixel compensation signal, and can also ensure the high refresh frequency of the display device. Moreover, the sub-pixel row for black insertion during the first sub-period in the display of one frame of the picture is operated for display during the second sub-period, and the sub-pixel row for display during the first sub-period is operated for black insertion during the second sub-period. It can ensure that each sub-pixel row is operated for display and black insertion during the whole display period of one frame of picture, which will not affect the user experience.

In an implementation, the display panel on which the gate driving circuit is disposed includes a plurality of rows of sub-pixels, and the driving method of the gate driving circuit further includes: during display of one frame of picture, the gate driving circuit outputting a first sense driving signal and a second sense driving signal corresponding to one row of sub-pixels; during display of a plurality of frames of pictures, controlling the gate driving circuit to sequentially output a first sense driving signal and a second sense driving signal on a corresponding row of sub-pixels row by row according to an order for driving the rows of sub-pixels. That is, the gate driving circuit drives the pixel circuit to sense the sub-pixel rows row by row. In other implementations, the gate driving circuit can drive the pixel circuit to randomly sense the sub-pixel rows.

Figure 7:
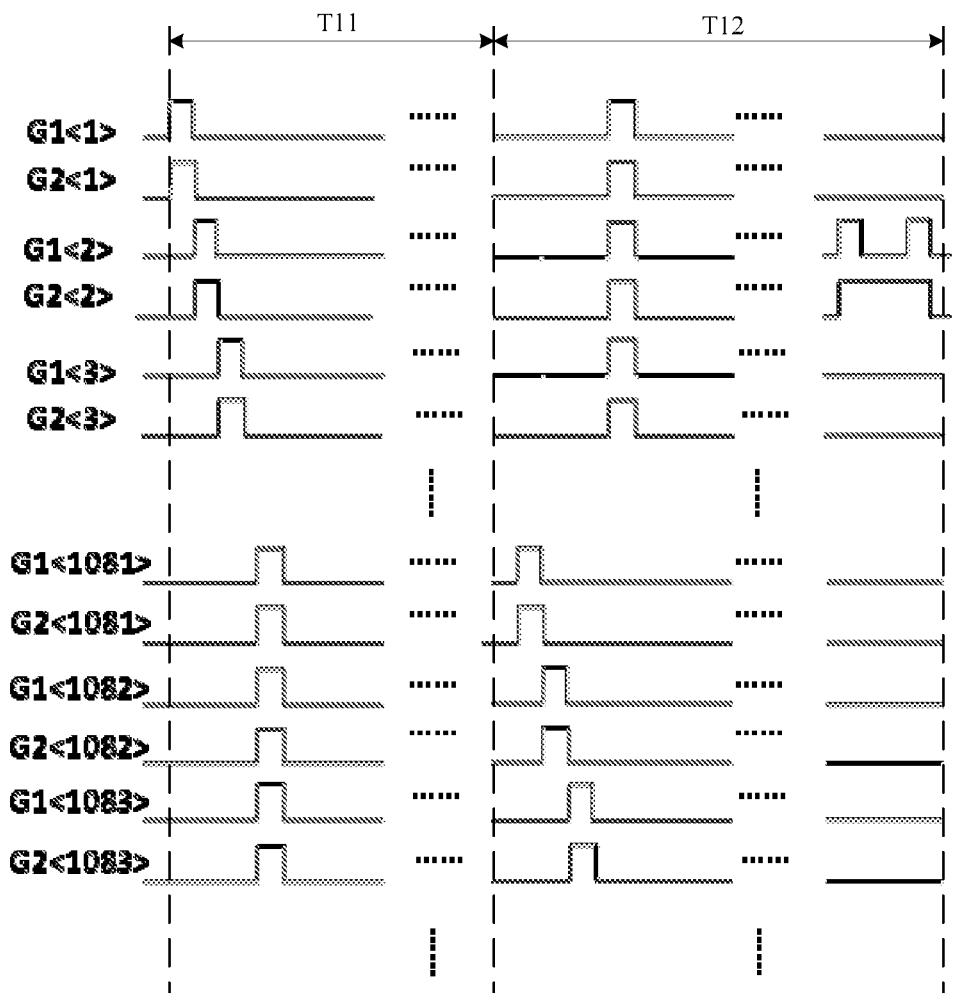
FIG. 7 is a driving timing sequence diagram of a gate driving circuit according to an example of the present disclosure.

In one implementation, the driving timing sequence of the gate driving circuit can be as shown in FIG. 7 during the display of one frame.

In the first sub-period T11, the first scan driving output terminals G1<1>~G1<1080> of the gate driving circuit sequentially output high-level display driving signals, and the second scan driving output terminals G2<1>~G2<1080> sequentially output high-level auxiliary driving signals; the first scan driving output terminal G1<1081> to the scan driving output terminal corresponding to the last row of sub-pixels output a high-level first black insertion driving signal, and the second scan driving output terminal G2<1081> to the scan driving output terminal corresponding to the last row of sub-pixels output a high-level second black insertion driving signal. That is, in the first sub-period T11, the shift registers corresponding to the sub-pixels in the first row to the 1080th row are in the display driving period, and the shift registers corresponding to the sub-pixels in the 1081th row to the last row are in the black insertion driving period.

In the second sub-period T12, the first scan driving output terminals G1<2> and G2<2> of the gate driving circuit first output a first sense driving signal, and then the first scan driving output terminals G1<1>—G1<1080> simultaneously output a high-level first black insertion driving signal, the second scan driving output terminals G2<1>—G2<1080> simultaneously output a high-level second black insertion driving signal, the first scan driving output terminal G1<1081> to the scan driving output terminal corresponding to the last row of sub-pixels sequentially output a high-level display driving signal, the second scan driving output terminal G2<1081>—to the second scan driving output terminal corresponding to the last row of sub-pixels sequentially output a high-level auxiliary driving signal. That is, in the first sub-period, the shift registers corresponding to the sub-pixels in the first row to the 1080th row are in the black insertion driving period, and the shift registers corresponding to the sub-pixels in the 1081st row to the last row are in the display driving period.

In the driving timing sequence shown in FIG. 7, sensing is performed on the second row of sub-pixels.

In one implementation, referring to FIG. 7, the first scan driving output terminal G1 and the second scan driving output terminal G2 of the same output unit of the same shift register can output signals at the same time; the shift registers of the same shift register unit can output a first black insertion driving signal and a second black insertion driving signal at the same time.

Figure 8:
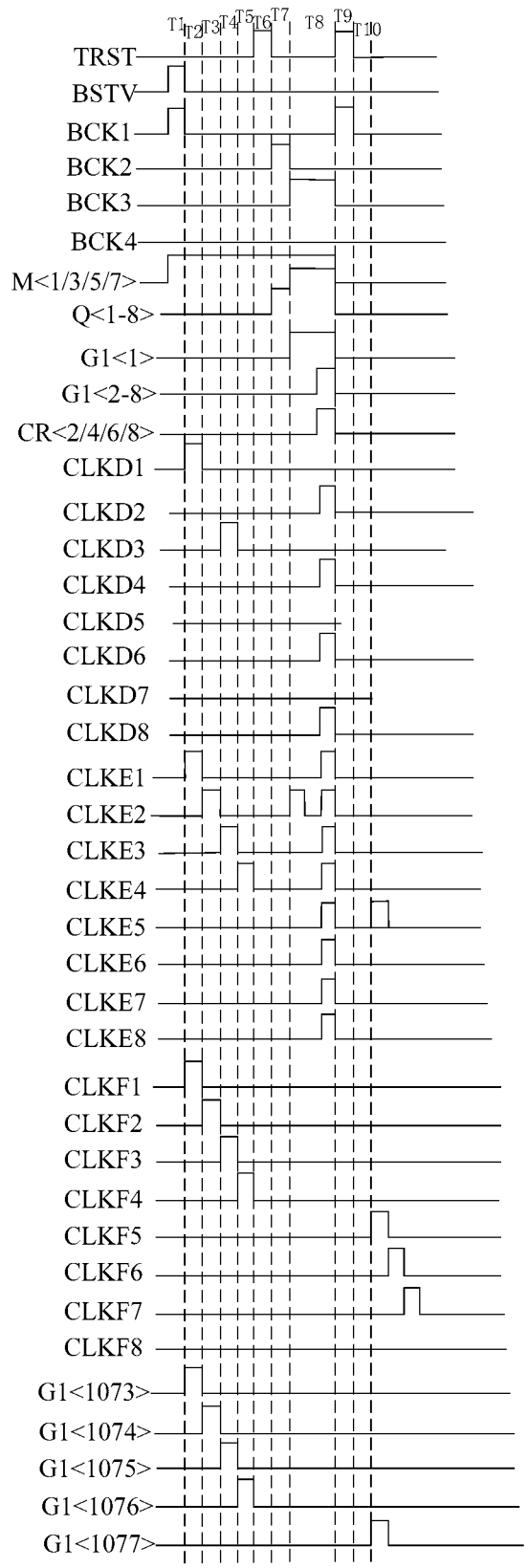
FIG. 8 is a driving timing sequence diagram of a gate driving circuit according to an example of the present disclosure.

In the following, in conjunction with FIG. 8, during the display of one frame, the sub-pixels in the second row are sensed during the black insertion of the sub-pixels in the first to eighth rows of the display device, and the sub-pixels in the 1073rd to 1076th rows are displayed at the same time. As an example, the driving process of the gate driving circuit will be described in detail.

In the time period T1, a black insertion start signal line BSTV and a clock signal line BCK1 provide high-level signals, and the first transistors M1 of the shift registers corresponding to the sub-pixels in the first row to the eighth row are turned on, so that a high-level signal is written into the black insertion control nodes M<1>, M<3>, M<5> and M<7>.

In time periods T2, T3, T4 and T5, a high-level signal is written into the black insertion control nodes M<1073>, M<1075>, M<1077> and M<1079>, and a high-level signal is written into the pull-up nodes Q<1073>~Q<1080>; the clock signal lines CLKE1, CLKE2, CLKE3 and CLKE4 output a high level sequentially, so that the first scan driving signal terminals G1<1073>, G1<1074>, G1<1075> and G1<1076> output a high level sequentially, and sub-pixels in the 1073rd to 1076th rows are displayed sequentially.

In the time period T6, a global reset signal line TRST provides a high-level signal, so that the levels of the pull-up nodes Q<1073>~Q<1080> are dragged low.

In the time period T7, the clock signal line BCK2 provides a high-level signal, so that the high-level signals at the black insertion control nodes M<1>, M<3>, M<5> and M<7> are input to the pull-up nodes Q<1>~Q<8>.

In the time period T8, the clock signal line BCK3 provides a high level signal, the clock signal line CLKE2 first outputs a high level and then outputs a low level, and the first scan driving signal output terminal G1<2> first outputs a high-level first black insertion driving signal to make the second row of sub-pixels to perform sensing; then, the clock signal lines CLKD2, CLKD4, CLKD6, CLKD8, CLKE1~CLKE8, and BCK3 provide high-level signals to control the first scan driving signal output terminals G1<1>~G1<8> to output high levels. At this time, the data signal terminal DATA provides a low-level signal, so that the driving transistor of the pixel circuit is turned off, and the sub-pixels in the first row to the eighth row stop emitting light; and at the same time, the high-level signals at the shift signal output terminals CR<2>, CR<4>, CR<6>, and CR<7> are input to the black insertion control nodes M<9>, M<11>, M<13>, and M<15>, and are maintained until the next black insertion driving stage.

Here, the clock signal lines CLKD2, CLKD4, CLKD6, and CLKD8 in the gate driving circuit can also be replaced by one clock signal line CLKD8.

In the time period T9, the global reset signal line TRST and the clock signal line BCK1 provide high-level signals, so that the levels at the pull-up nodes Q<1>—Q<8> and the black insertion control nodes M<1>, M<3>, M<5> and M<7> are dragged low.

In the time period T10, the clock signal line BCK6 provides a high-level signal, so that the high-level signals at the black insertion control nodes M<1073>, M<1075>, M<1077>, M<1079> are input to the pull-up nodes Q<1073>—Q<1080>, the shift registers corresponding to the sub-pixels in the 1073rd to 1080th rows enters the display driving stage again.

In the time period T11, the clock signal lines CLKD5, CLKE5, and CLKF5 provide high-level signals, and the scan driving signal output terminal G1<1077> outputs a display driving signal corresponding to the 1077th row of sub-pixels.

By repeating the above-mentioned cycle, during the display of one frame of picture, a part of the pixel rows of the display device can perform black insertion while the other part of the pixel rows can perform display. In the above driving process, the sub-pixels from the 1073th row to the 1077th row perform display while the first row to the 8th row perform black insertion, which is only an example for illustration. In other implementations, the sub-pixel rows for simultaneous display and black insertion can be different from this.

An embodiment of the present disclosure also provides a display device. The display device includes the gate driving circuit described in any of the above implementations and the plurality of rows of sub-pixels.

When the shift registers of the gate driving circuit includes a first output circuit and a second output circuit, the output terminal of the first output circuit and the output terminal of the second output circuit are respectively connected to the pixel circuits corresponding to the sub-pixels in different rows.

The display device also includes a display module and a pixel circuit.

It should be noted that the display device in this embodiment can be any product or component with display function, such as electronic paper, mobile phone, tablet computer, television, notebook computer, digital photo frame, navigator, etc.

It should be pointed out that in the drawings, the sizes of layers and regions can be exaggerated for clarity of illustration. It will also be understood that when an element or layer is referred to as being "on" another element or layer, it can be directly on the other element or intervening layers can be present. In addition, it will be understood that when an element or layer is referred to as being "under" another element or layer, it can be directly under the other element, or there can be more than one intervening layer or element. In addition, it can also be understood that when a layer or element is referred to as being "between" two layers or two elements, it can be the only layer between the two layers or two elements, or more than one intervening layer or element can also be present. Similar reference numerals indicate similar elements throughout.

In the present disclosure, the terms "first" and "second" are only used for descriptive purposes, and cannot be understood as indicating or implying relative importance. The term "plurality" refers to two or more, unless specifically defined otherwise.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes can be made without departing from the scope thereof. The scope of the present disclosure is limited only by the appended claims.

What is claimed is:

1. A driving method of a shift register, applied for a shift register, wherein the shift register is used to drive a pixel circuit, the pixel circuit is used to drive a sub-pixel; the pixel circuit comprises a switching transistor, a driving transistor, a storage capacitor, a sensing transistor, and a control node, a first electrode of the sensing transistor, the sub-pixel and the driving transistor are respectively connected to the control node; the shift register comprises a display input circuit, a black insertion input circuit and an output circuit, the output circuit is used to output a composite driving signal, the composite driving signal comprises a display driving signal, a first sense driving signal, a second sense driving signal, and a black insertion driving signal; during display of one frame of picture, the black insertion driving signal is output after the first sense driving signal and the second sense driving signal;

the driving method of the shift register comprises:
  in a display driving period, the display input circuit, in response to a display control signal, causing the output circuit to output the display driving signal, so that a control electrode of the switching transistor receives the display driving signal to turn on the switching transistor, a first electrode of the switching transistor receives a display data signal, and the sub-pixel emits light; and
  in a black insertion driving period, the black insertion input circuit, in response to a black insertion control signal, causing the output circuit to first output a first sense driving signal and a second sense driving signal, so that the control electrode of the switching transistor receives the first sense driving signal to turn on the switching transistor, the first electrode of the switching transistor receives a sensing data signal, and the control electrode of the sensing transistor receives the second sense driving signal to turn on the sensing transistor, and a second electrode of the sensing transistor outputs a pixel compensation signal, and at the same time the sub-pixel stops emitting light; then the output circuit outputs a black insertion driving signal, and the pixel circuit receives the black insertion driving signal to turn off the driving transistor, and the sub-pixel keeps not emitting light.

2. The driving method of a shift register according to claim 1, wherein the black insertion driving signal comprises a first black insertion driving signal; the output circuit outputting a black insertion driving signal, and the pixel circuit receiving the black insertion driving signal to turn off the driving transistor comprises:
  the output circuit outputting a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor;

or,
  wherein the black insertion driving signal comprises a first black insertion driving signal and a second black insertion driving signal; the output circuit outputting a black insertion driving signal, and the pixel circuit receiving the black insertion driving signal to turn off the driving transistor comprises:
  the output circuit outputting the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor, the second electrode of the sensing transistor receives the second black data signal and writes the second black data signal into the storage capacitor to turn off the driving transistor;

or,
  the black insertion driving signal comprises a second black insertion driving signal; the output circuit outputting a black insertion driving signal, and the pixel circuit receiving the black insertion driving signal to turn off the driving transistor comprises:
  the output circuit outputting a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

3. A shift register, wherein the shift register is used to implement the driving method of a shift register according to claim 1, the shift register comprises a black insertion input circuit, a display input circuit, a pull-up node and an output circuit;

an output terminal of the black insertion input circuit and an output terminal of the display input circuit are respectively connected to the pull-up node to charge the pull-up node; and a control terminal of the output circuit is connected to the pull-up node, in a display driving period, the display input circuit charges the pull-up node in response to a display control signal, and under the control of the pull-up node, an output terminal of the output circuit outputs a display driving signal; in a black insertion driving period, the black insertion input circuit charges the pull-up node in response to a black insertion control signal, and under the control of the pull-up node, the output terminal of the output circuit first outputs a first sense driving signal and a second sense driving signal, and then outputs a black insertion driving signal.

4. The shift register according to claim 3, wherein the black insertion driving signal comprises a first black insertion driving signal; the output circuit outputs a black insertion driving signal, and the pixel circuit receives the black insertion driving signal to turn off the driving transistor, comprising:

the output circuit outputting a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor;

or, wherein the black insertion driving signal comprises a first black insertion driving signal and a second black insertion driving signal; the output circuit outputs a black insertion driving signal, and the pixel circuit receives the black insertion driving signal to turn off the driving transistor, comprising:

the output circuit outputting the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor, the second electrode of the sensing transistor receives the second black data signal and writes the second black data signal into the storage capacitor to turn off the driving transistor;

or, the black insertion driving signal comprises a second black insertion driving signal; the output circuit outputs a black insertion driving signal, and the pixel circuit receives the black insertion driving signal to turn off the driving transistor, comprising:

the output circuit outputting a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

5. The shift register according to claim 3, wherein the output circuit comprises a first output unit and a second output unit, and the display input circuit comprises a first display input unit and a second display input unit, and the pull-up node comprises a first pull-up node and a second pull-up node;

the output terminal of the black insertion input circuit is respectively connected to the first pull-up node and the second pull-up node; an output terminal of the first display input unit is connected to the first pull-up node, and a control terminal of the first output unit is connected to the first pull-up node; an output terminal of the second display input unit is connected to the second pull-up node, and a control terminal of the second output unit is connected to the second pull-up node; the first output unit and the second output unit respectively output composite driving signals for driving sub-pixels in different rows.

6. The shift register according to claim 5, wherein the shift register further comprises a black insertion pre-charging circuit and a black insertion control node, and an output terminal of the black insertion pre-charging circuit is connected to the black insertion control node, the black insertion pre-charging circuit is used to charge the black insertion control node; a control terminal of the black insertion input circuit is connected to the black insertion control node; an output terminal of the black insertion input circuit is respectively connected to the first pull-up node and the second pull-up node; and the black insertion control signal comprises a potential at the black insertion control node and the black insertion input signal; the black insertion input circuit, in response to the potential at the pull-up control node and a black insertion input signal, charges the first pull-up node and the second pull-up node.

7. The shift register according to claim 3, wherein the shift register further comprises a pull-down control circuit and a pull-down node; the output circuit further comprises a pull-down circuit;

the pull-down control circuit is used to control the level of the pull-down node, and the pull-down circuit responds to the level of the pull-down node to pull down reset the pull-up node and the output terminal of the output circuit.

8. A display device, wherein the display device comprises the gate driving circuit according to claim 7 and a display panel, and the display panel comprises a plurality of rows of sub-pixels and a pixel circuit for driving the sub-pixels;

when a shift register of the gate driving circuit comprises a first output unit and a second output unit, an output terminal of the first output unit and the output terminal of the second output unit are respectively connected to the pixel circuits corresponding to the sub-pixels in different rows.

9. The display device according to claim 8, wherein the black insertion driving signal comprises a first black insertion driving signal; the output circuit outputs a black insertion driving signal, and the pixel circuit receives the black insertion driving signal to turn off the driving transistor, comprising:

the output circuit outputting a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor;

or, wherein the black insertion driving signal comprises a first black insertion driving signal and a second black insertion driving signal; the output circuit outputs a black insertion driving signal, and the pixel circuit receives the black insertion driving signal to turn off the driving transistor, comprising:

the output circuit outputting the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor, the second electrode of the sensing transistor receives the second black data signal and writes the second black data signal into the storage capacitor to turn off the driving transistor;

or, the black insertion driving signal comprises a second black insertion driving signal; the output circuit outputs a black insertion driving signal, and the pixel circuit receives the black insertion driving signal to turn off the driving transistor, comprising:

the output circuit outputting a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

10. The display device according to claim 8, wherein the output circuit comprises a first output unit and a second output unit, and the display input circuit comprises a first display input unit and a second display input unit, and the pull-up node comprises a first pull-up node and a second pull-up node;

the output terminal of the black insertion input circuit is respectively connected to the first pull-up node and the second pull-up node; an output terminal of the first display input unit is connected to the first pull-up node, and a control terminal of the first output unit is connected to the first pull-up node; an output terminal of the second display input unit is connected to the second pull-up node, and a control terminal of the second output unit is connected to the second pull-up node; the first output unit and the second output unit respectively output composite driving signals for driving sub-pixels in different rows.

11. The display device according to claim 10, wherein the shift register further comprises a black insertion pre-charging circuit and a black insertion control node, and an output terminal of the black insertion pre-charging circuit is connected to the black insertion control node, the black insertion pre-charging circuit is used to charge the black insertion control node; a control terminal of the black insertion input circuit is connected to the black insertion control node; an output terminal of the black insertion input circuit is respectively connected to the first pull-up node and the second pull-up node; and the black insertion control signal comprises a potential at the black insertion control node and the black insertion input signal; the black insertion input circuit, in response to the potential at the pull-up control node and a black insertion input signal, charges the first pull-up node and the second pull-up node.

12. The display device according to claim 8, wherein the shift register further comprises a pull-down control circuit and a pull-down node; the output circuit further comprises a pull-down circuit;

the pull-down control circuit is used to control the level of the pull-down node, and the pull-down circuit responds to the level of the pull-down node to pull down reset the pull-up node and the output terminal of the output circuit.

13. A gate driving circuit, comprising a plurality of cascaded shift registers, the shift register being the shift register according to claim 3.

14. The gate driving circuit according to claim 13, wherein the black insertion driving signal comprises a first black insertion driving signal; the output circuit outputs a black insertion driving signal, and the pixel circuit receives the black insertion driving signal to turn off the driving transistor, comprising:

the output circuit outputting a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor;

or, wherein the black insertion driving signal comprises a first black insertion driving signal and a second black insertion driving signal; the output circuit outputs a black insertion driving signal, and the pixel circuit receives the black insertion driving signal to turn off the driving transistor, comprising:

the output circuit outputting the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor, the second electrode of the sensing transistor receives the second black data signal and writes the second black data signal into the storage capacitor to turn off the driving transistor;

or, the black insertion driving signal comprises a second black insertion driving signal; the output circuit outputs a black insertion driving signal, and the pixel circuit receives the black insertion driving signal to turn off the driving transistor, comprising:

the output circuit outputting a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

15. The gate driving circuit according to claim 13, wherein the output circuit comprises a first output unit and a second output unit, and the display input circuit comprises a first display input unit and a second display input unit, and the pull-up node comprises a first pull-up node and a second pull-up node;
   the output terminal of the black insertion input circuit is respectively connected to the first pull-up node and the second pull-up node; an output terminal of the first display input unit is connected to the first pull-up node, and a control terminal of the first output unit is connected to the first pull-up node; an output terminal of the second display input unit is connected to the second pull-up node, and a control terminal of the second output unit is connected to the second pull-up node; the first output unit and the second output unit respectively output composite driving signals for driving sub-pixels in different rows.

16. The gate driving circuit according to claim 15, wherein the shift register further comprises a black insertion pre-charging circuit and a black insertion control node, and an output terminal of the black insertion pre-charging circuit is connected to the black insertion control node, the black insertion pre-charging circuit is used to charge the black insertion control node; a control terminal of the black insertion input circuit is connected to the black insertion control node; an output terminal of the black insertion input circuit is respectively connected to the first pull-up node and the second pull-up node; and
   the black insertion control signal comprises a potential at the black insertion control node and the black insertion input signal; the black insertion input circuit, in response to the potential at the pull-up control node and a black insertion input signal, charges the first pull-up node and the second pull-up node.

17. The gate driving circuit according to claim 13, wherein the shift register further comprises a pull-down control circuit and a pull-down node; the output circuit further comprises a pull-down circuit;
   the pull-down control circuit is used to control the level of the pull-down node, and the pull-down circuit responds to the level of the pull-down node to pull down reset the pull-up node and the output terminal of the output circuit.

18. A driving method of a gate driving circuit, wherein the driving method is used in the gate driving circuit of claim 13; a display period of one frame of picture comprises a first sub-period and a second sub-period, and the gate driving circuit comprises n shift registers,
   the driving method of the gate driving circuit comprises:
   in the first sub-period, controlling a 1st stage to a mth stage shift registers to be in a display driving stage; controlling a (m+1)th stage to a nth stage shift register to be in a black insertion driving stage, and controlling one of shift registers of the (m+1)th stage shift register to the nth stage shift register to first output a first sense driving signal and a second sense driving signal, and then output a black insertion driving signal and controlling other shift registers to output only the black insertion driving signal; where m>1, m+1<n, and both m and n are positive integers; and
   in a second sub-period, controlling the 1st stage to the mth stage shift registers to be in a black insertion driving stage; controlling one of the shift registers of the first stage shift register to the mth stage shift register to first output a first sense driving signal and a second sense driving signal, and then output a black insertion driving signal and controlling other shift registers to output only the black insertion driving signal; controlling the (m+1)th stage to the nth stage shift registers to be in a display driving stage.

19. The driving method of a gate driving circuit according to claim 18, wherein the display panel on which the gate driving circuit is disposed comprises a plurality of rows of sub-pixels, and the driving method of the gate driving circuit further comprises: during display of one frame of picture, the gate driving circuit outputting a first sense driving signal and a second sense driving signal corresponding to one row of sub-pixels; during display of a plurality of frames of pictures, controlling the gate driving circuit to sequentially output a first sense driving signal and a second sense driving signal on a corresponding row of sub-pixels row by row according to an order for driving the rows of sub-pixels.

20. The driving method of a gate driving circuit according to claim 18, wherein the black insertion driving signal comprises a first black insertion driving signal; the output circuit outputs a black insertion driving signal, and the pixel circuit receives the black insertion driving signal to turn off the driving transistor, comprising:
   the output circuit outputting a first black insertion driving signal, so that after the control electrode of the switching transistor receives the first black insertion driving signal, the switching transistor is turned on, and the first electrode of the switching transistor receives a first black data signal and writes the first black data signal into the storage capacitor to turn off the driving transistor;
   or,
   wherein the black insertion driving signal comprises a first black insertion driving signal and a second black insertion driving signal; the output circuit outputs a black insertion driving signal, and the pixel circuit receives the black insertion driving signal to turn off the driving transistor, comprising:
   the output circuit outputting the first black insertion driving signal and the second black insertion driving signal, so that the control electrode of the switching transistor receives the first black insertion driving signal to turn on the switching transistor, and the control electrode of the sensing transistor receives the second black insertion driving signal to turn on the sensing transistor, and then the first electrode of the switching transistor receives the first black data signal and writes the first black data signal into the storage capacitor, the second electrode of the sensing transistor receives the second black data signal and writes the second black data signal into the storage capacitor to turn off the driving transistor;
   or,
   the black insertion driving signal comprises a second black insertion driving signal; the output circuit outputs a black insertion driving signal, and the pixel circuit receives the black insertion driving signal to turn off the driving transistor, comprising:
   the output circuit outputting a second black insertion driving signal, so that after the control electrode of the sensing transistor receives the second black insertion driving signal, the sensing transistor is turned on, and then the second electrode of the sensing transistor receives a second black data signal and writing the second black data signal into the storage capacitor to turn off the driving transistor.

* * * * *